United States Patent [19]

Wroblewski

[11] Patent Number: 5,036,320

[45] Date of Patent: Jul. 30, 1991

[54] SMART MULTIPLE SWITCH SCANNER, SINGLE WIRE BUS MULTIPLEX SYSTEM THEREFOR

[75] Inventor: Thomas R. Wroblewski, Sterling Heights, Mich.

[73] Assignee: Chrysler Corporation, Highland Park, Mich.

[21] Appl. No.: 386,749

[22] Filed: Jul. 31, 1989

[51] Int. Cl.⁵ ............................................ H03K 17/94
[52] U.S. Cl. ................................... 341/26; 341/22
[58] Field of Search ............... 341/22, 26, 30; 84/617, 84/655, 682

[56] References Cited

U.S. PATENT DOCUMENTS

| | | | |
|---|---|---|---|
| 4,343,216 | 8/1982 | Swain et al. | 84/617 |
| 4,706,068 | 11/1987 | Eberhard | 341/26 |
| 4,872,008 | 10/1989 | Ohtsuka et al. | 341/26 |
| 4,884,070 | 11/1989 | Hannaford | 341/26 X |

Primary Examiner—Ulysses Weldon
Attorney, Agent, or Firm—Wendell K. Fredericks

[57] ABSTRACT

A smart multiplex scanner system for scanning a matrix of switches utilizes counter of a chosen modulo value that counts to that chosen value for generating row and column enable signals that are used to sequentially scan the switches of the matrix.

10 Claims, 4 Drawing Sheets

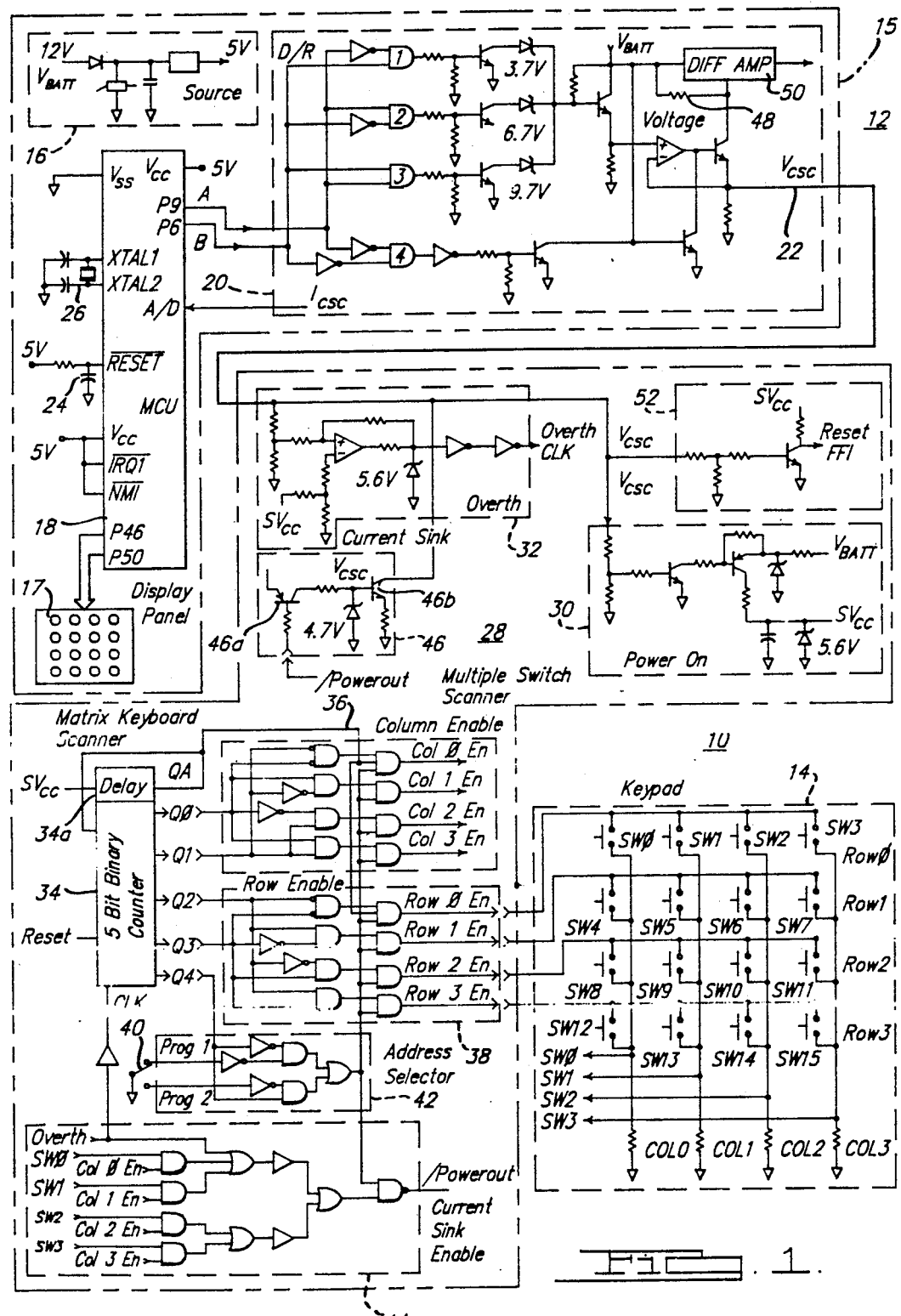

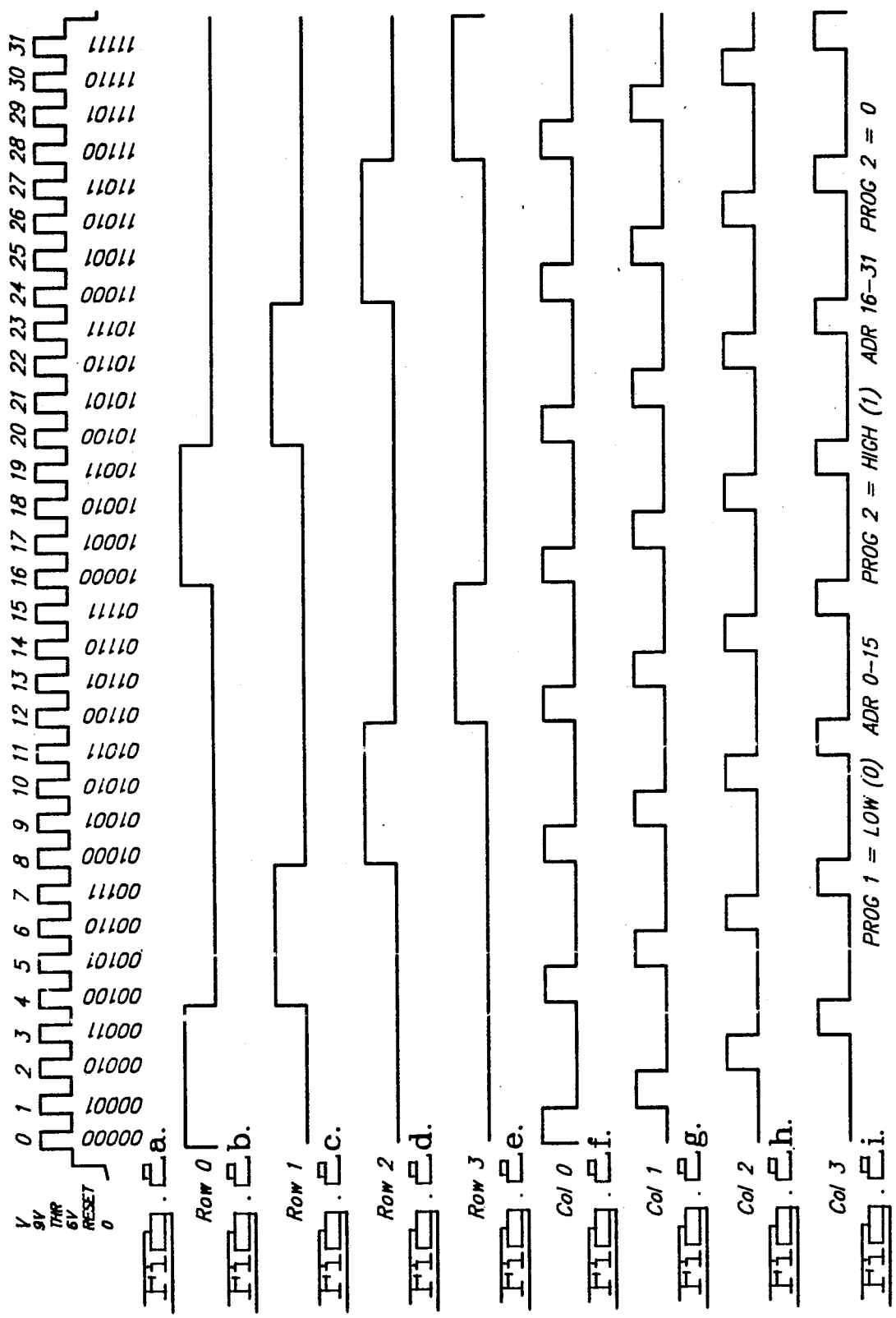

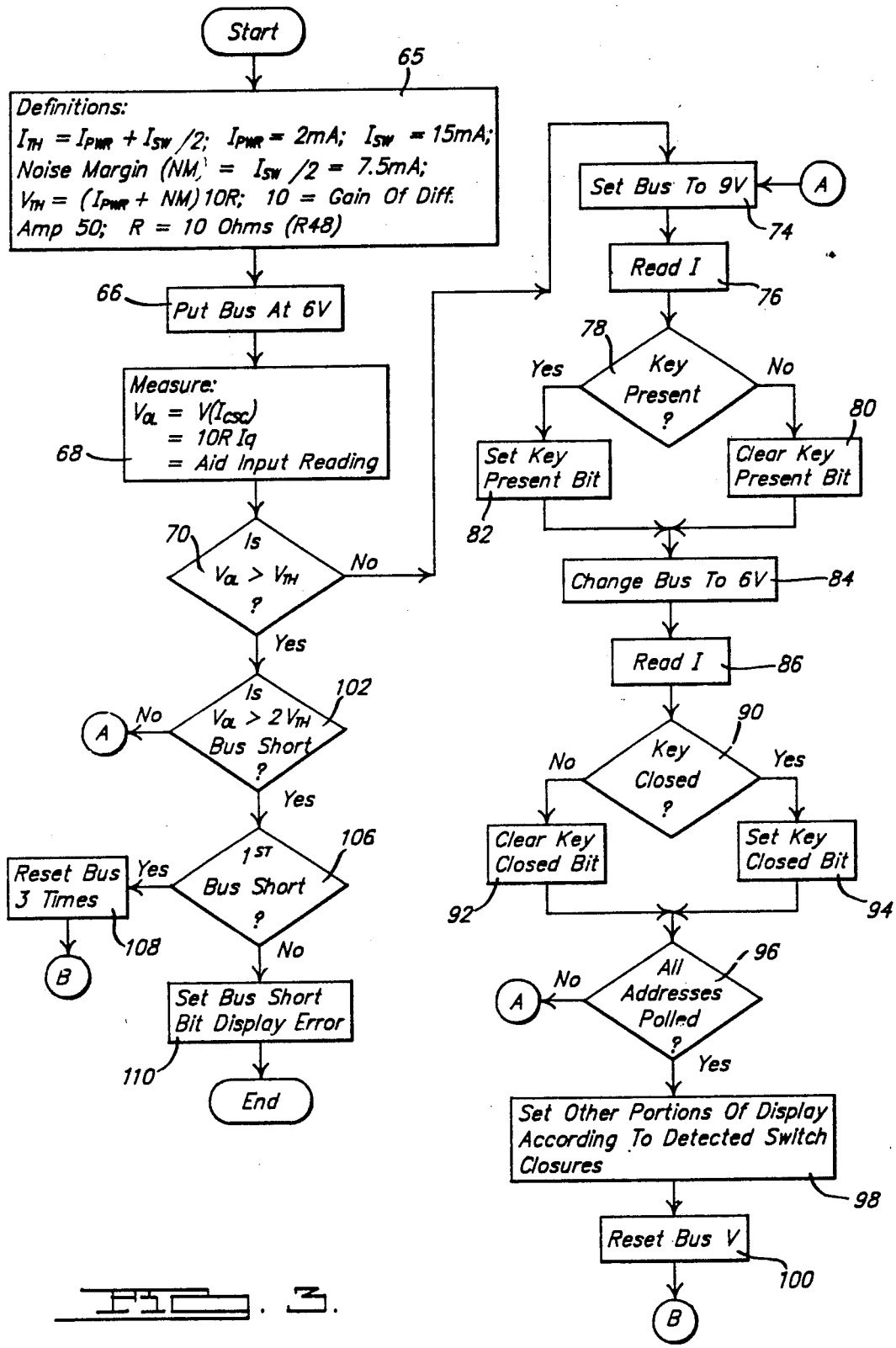

SMART MULTIPLE SWITCH SCANNER, SINGLE WIRE BUS MULTIPLEX SYSTEM THEREFOR

BACKGROUND OF THE INVENTION

1. Field of the Invention

This invention relates to multiplexing techniques for obtaining status of a plurality of switches disposed at a remote location in the form of a matrix keypad and connected to a controller by a single wire bus and, more particularly, in a preferred embodiment to systems for generating visual displays at a remote instrument panel indicative of the status of each switch of the matrix, the switches being separately scanned by a switch scanner that connects at a single point to the single wire bus and controlled by a remote microcontroller.

2. Description of the Prior Art

Scanning matrices of switches or keys of a keypad has generally been done by microcomputers or controllers using complex software. Where separate keyboards are employed, a serial link between the controller and the keyboard usually improves reliability and saves on cable usage but further complicates the protocol between devices.

In an effort to place a matrix of switches at a remote location and use a minimum number of wires between the controller and the matrix, a search was initiated for a scheme that would use as few as a single wire between devices. That search resulted in the improved matrix scanner system of the present invention.

BRIEF SUMMARY OF THE INVENTION

The present invention is concerned with a single wire bus smart keypad controller system for supplying power to a keypad scanner and the associated keypad and for sequentially scanning each key switch of the keypad matrix in order to read each key switch and then use the switch information to display information indicative of the status of the addressed switch. A driver/receiver (D/R) unit controlled by a microcontroller (MCU) contains an off-set squarewave generator circuit which develops an off-set squarewave voltage pulse train. Superimposed over the initial "state" of the voltage signal are coded pulse signals used for addressing switches within the keypad matrix.

The D/R unit drives the pulse train in a first direction over a single wire bus to the scanner module connected to the bus. The off-set squarewave train places several "states" of voltage level signals on the bus; the scanner module responds to an initial "state" of the voltage signal which provides power to turn on the scanner.

A toggle-type up-counter contained in the scanner module provides sequential bit data to combinational logic for enabling the columns and rows of the keypad matrix so as to address the switches. The counter has a modulo count equal to the number of switches in the matrix but a novel counter arrangement is formed that permits using the counter to generate address counts equal to the modulo count. Both leading and trailing transitions of the pulse signals enable circuits in the scanner module. The scanner module then transmits back over the bus electric current signals which are received, interpreted and then converted by the D/R unit into voltage signals.

The D/R unit transfers these voltage signals to the MCU which ascertains whether or not a switch has been addressed and is present during the leading transition of the pulse and then whether the switch is opened or closed during the trailing transition. An input/output port of the MCU is used to transfer this switch status information to an instrument console where the addressed switch data is displayed visually on a display panel. Switches in the matrix may be associated with, illustratively, adjustments of the radio volume, the dialing of the radio displaying speed, temperature, etc.

BRIEF DESCRIPTION OF THE DRAWING

FIG. 1 is a partial block, partial schematic diagram of a single-wire bus, keypad controller system which sets the operating environment for the matrix keypad according to the invention;

FIG. 2a is a waveform/address sequence diagram depicting the polling of the keypad switches and the various voltage states of the off-set squarewave used by the scanner module. FIGS. 2b through 2i depict the timing of the row and column enable signals generated by the combinational logic used by the scanner module to scan the keys of the keypad in response to the polling sequence depicted in FIG. 2a; and FIG. 3 is a flow chart that describes firmware instructions to a microcontroller in this invention.

DETAILED DESCRIPTION OF A PREFERRED EMBODIMENT

Figure 1A:
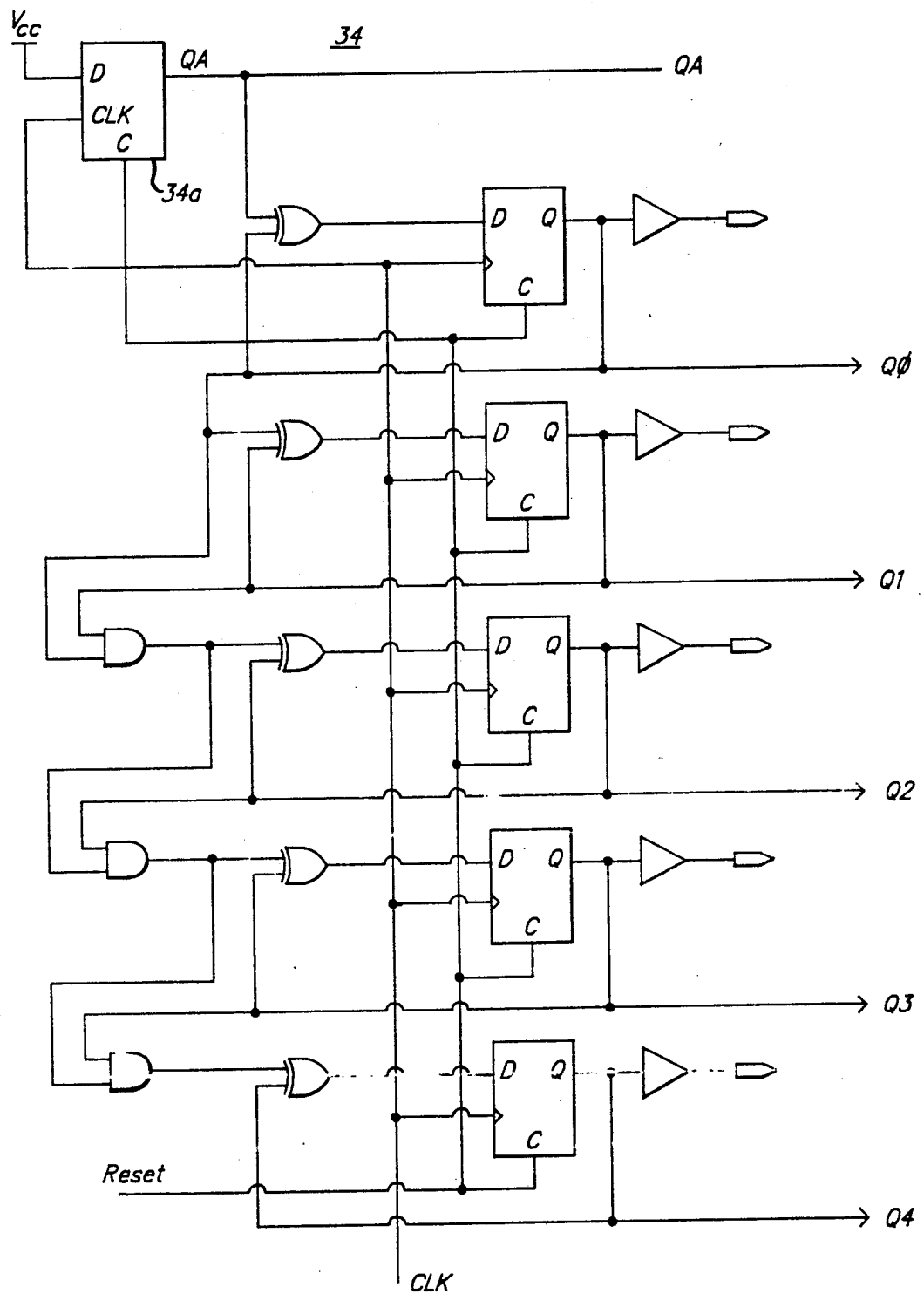
FIG. 1A is a logic circuit diagram of the delay and counter circuit for the scanner of FIG. 1.

Referring now to FIGS. 1 through 3, FIG. 1 is a partial block diagram, partial schematic diagram of a preferred embodiment of a single-wire bus, smart keypad scanner system 10.

With +12 volts DC batteries supply voltage supplied to an instrument compartment 12 incorporating system 10, a display of status information about each switch SW0–SW31 of matrix keypad 14 appears on a display panel 17.

CONTROL UNIT

A control unit 15 comprised of a regulated 5-volt regulator circuit 16, an MCU 18 and a driver/receiver (D/R) unit 20 connects between a battery and a single wire bus 22 for generating power as well as for providing signals for scanning a keypad 14.

To establish a precise 5-volt source for microcontroller operations, regulator circuit 16 connects between the battery and MCU 18. The battery output voltage, illustratively, 12 VDC±25% enters an input circuit of regulator 16 wherein suitable voltage regulation occurs to maintain a precise output voltage (e.g., 5 volts DC+or−2.5%). Regulator 16 also provides, after an externally programmed delay, a 5-volt DC signal for resetting MCU 18 during a POWER-ON phase. The 5-volt DC signal which is supplied to a not reset (/reset) terminal of MCU 18 provides a delayed signal allowing D/R 18 to become ready for MCU control.

Note that presentation of logic signals and equations will employ a "+" symbol to denote an OR function, a "*" symbol to denote an AND function, and a "/" symbol prefix of a logic name to mean the complement of the logic name. Capacitor 24 provides the external program delay function, holding the output voltage from regulator 16 LOW for a fraction of time (e.g., 20 milliseconds) delaying the start-up of MCU 20. After the delay, the /reset goes HIGH and MCU 18 starts executing a factory installed program (the firmware) stored in ROM of MCU 18.

MCU 18, illustratively, a single chip 8-bit unit such as a Motorola MC68705S3 microcontroller, contains a CPU ON-chip clock, ROM, RAM, input/output interface (I/0), analog to digital converter (ADC) and a timer. The ON-chip clock is controlled by an external oscillator 26.

MCU 18 generates logic signals from ports A and B which go to D/R 20 to develop a bus off-set, squarewave voltage signal $V_{CSC}$ similar to that shown in FIG. 2a. This $V_{CSC}$ provides power and control signals for operating the scanner and address signals for addressing the keys of the keypad. This off-set squarewave voltage signal comprises five states; namely, an OFF state or 0 volt, a reset state, 3 volts, a 6-volt state, a threshold-voltage $V_{thr}$ state of approximately 7.5 volts and a 9-volts state. The reset state occurs during transitions from the 0-volt to the 6-volts state or vice-versa. The threshold state results during the transitions from the 6-volts to the 9-volts state as well as the transitions from the 9-volts to the 6-volts state.

SINGLE WIRE BUS

As mentioned supra, bus 22, a bi-directional signal wire communication assembly, allows transmissions of the off-set voltage pulse train from D/R 20 to the multiple switch scanner 28. Illustratively, this single wire may consist of a flexible length of wire of a suitable gauge covered with an insulative material at all points except for scanner interface regions. Bus 22 should possess some degree of flexibility in order to route in the vicinity of all the remote switches that require the scanning operation.

As shown in FIG. 1, D/R 20 connected between MCU 18 and bus 22 contains suitable digital logic circuits and linear devices for generating the waveform of FIG. 2A. Digital inputs from MCU 18 placed at terminals A and B enters the input of D/R 20 and leaves as $V_{CSC}$ on bus 22. $V_{CSC}=0$ volt when MCU 18 sends /A * /B levels to the input of D/R 20; $V_{CSC}=3$ volts when /A * B appear; $V_{CSC}=6$ volts when A * /B appear and $V_{CSC}32$ 9 volts when A * B appear. MCU 18 writes the digital inputs to D/R 20 at a chosen rate.

MULTIPLE SWITCH SCANNER

Multiple switch scanner 28 located remote from D/R 20, but connected to bus 22 at a single point, utilizes the $V_{CSC}$ signal to develop a POWER-ON scanner voltage, $SV_{CC}$. Within scanner 28, the POWER-ON circuit 30, illustratively, a transistor circuit operated in a linear mode, connects between the battery to receive battery power $V_{batt}$ and bus 22 to obtain $V_{CSC}$ power. The POWER-ON circuit 30 provides $SV_{CC}$ voltage as long as $V_{CSC}$ from the bus remains above 3 volts. SVcc is available during the transmission of each 32 address pulses of the pulse train of $V_{CSC}$.

Also, within scanner 28 an over-threshold circuit 32 connected between bus 22 and the output of the POWER-ON circuit 30 contains, illustratively, an operational amplifier for providing an over-threshold clock signal (OVERTH CLK) when $V_{CSC}$ goes above, illustratively, 7.5 volts. The clock signal from over-threshold circuit 32 clocks a 5-bit binary counter 34 that contains a delay circuit to produce scanning logic signals Q0–Q4 used to develop 32 switch addresses, one binary clock signal for addressing or scanning each switch.

The scanning logic signals from counter 34 enter column enable combinational logic circuit 36 and row enable combinational logic circuit 38 as shown in FIG. 1 and, as depicted in FIG. 2a–2i, enables row 0 initially of the matrix and then enables in succession columns 0 through 3. Then row 1 is enabled and column 0 through 3 are enabled. This process continues until all the columns and rows of the matrix are separately enabled.

MATRIX ARRANGED SWITCHES

The row enable signals route to the switch matrix key pad circuit 14. Only 16 switches appear on FIG. 1, but this embodiment scans up to 32 switches. Address selector circuit 42, connected between the binary counter 34 and the column and row enable circuits 36 and 38 respectively, and a /POWER-OUT circuit 44 comprised or combinational logic circuits provide scanning of the first 16 switches, switches 0–15, when a manual switch 40 is positioned to program 1 and scanning of the next 16 switches when switch 40 is positioned to program 2. Keypad 14 contains conventional normally open switches and suitable pull-down resistors disposed at the terminations of the columns of the matrix. Output signals SW-0 through SW-3 from column 0 through column 3, respectively, provide input signals to the combinational logic of the /POWER-OUT circuit 44. The column enable circuits 36 and row enable circuits 38 provide input signals to the combinational logic /POWER-OUT circuit 44 which produces a /POWER-OUT signal used as a current sink enable signal. The /POWER-OUT signal generates to indicate the presence of the threshold as in equation 1.

$$/POWER\text{-}OUT = (/PROG1 */Q4[\text{output from stage 4 of counter } 34] + /PROG2 *Q4) * OVERTH \quad (1)$$

POLLING ROUTINE

The /POWER-OUT signal also routes to current sink circuit 46 when the trailing edge of each off-set squarewave pulse used to clock the 5-bit binary counter 34 goes below the threshold voltage as in equation 2.

$$/POWER\text{-}OUT = (/PROG1 */Q4 + /PROG2 * Q4) * \quad (2)$$
$$(OVRTH + SW0 * COL0en + SW1 * COL1en +$$
$$SW2 * COL2en + SW3 * COL3en)$$

If an addressed keypad switch is closed, the current sink circuit 46 will cause the bus current to sink to ground through a relatively low resistance. If an addressed keypad switch is opened, the bus will draw only the quiescent current.

When the bus current sinks to ground through the low resistance, the bus current flows through resistor 48 in the driver/receiver module D/R 20. Differential amplifier 50 provides an output current signal ($I_{CSC}$) or a voltage equivalent signal to the A/D input of the ADC in MCU 18.

MCU18 compares the address sent out over ports 6 and 9 with the response from the ADC to determine the status of the addressed keypad switch. The status information of the keyboard switch is displayed on the display panel 17 and, if necessary, routed to other peripheral devices that might use such information.

RESET CIRCUIT

After scanning the 32 switches, scanner circuit 28 contains a reset circuit 52 for resetting counter 34 which responds to that portion of $V_{CSC}$ that falls to 3 volts.

The input of reset circuit 52 connects to bus 22 and the output connects to the counter 34 to provide, illustratively, a 5-volt reset signal to a reset port of counter 34 when the bus voltage goes below 3 volts.

OPERATION OF THE SYSTEM

Referring now to FIGS. 1, 1A and 2, after power is applied, system 10 operates when MCU 18 writes to ports 6 and 9 causing D/R 20 to develop the bus off-set, square-wave voltage signal $V_{CSC}$. Then D/R 20 transmits the $V_{CSC}$ over bus 22 to scanner 28. Within scanner 28, circuit 32 generates a clock signal in response to the rising edge of each pulse in $V_{CSC}$ that exceeds the threshold voltage, the pulses being depicted in FIG. 2a. The over-threshold clock signal then routes to counter 34.

When exerted by the initial over-threshold clock signal, a single high bit is latched into the QA bit D flip-flop. The D input to the QA flip-flop of counter 34 is clamped at $V_{CC}$ until a reset pulse occurs. As shown in FIG. 1, the QA bit enables column 0 and row 0 since Q0 through Q4 of the counter are reset. The act of enabling column 0 and row 0 addresses switch 0 with an address of 00000. The delay circuit that generates QA of counter 34 makes it possible to assert counter 34 yet delay the counting cycle of the 5-bit sequential counter. With the delay circuit 34A, the modulo 5 sequential counter portion of counter 34, which actually counts to 31 and not to 32, can provide 32 addresses for system 10 as indicated in FIG. 2a. The binary addresses generated by counter 34 corresponds with the decimal number of the switches 0 to 15 under program 1 and 16 to 31 under program 2.

The /POWER-OUT sink enable circuit 44 operates in response to the off-set squarewave pulses as long as the edges of the pulses are above the threshold voltage level. This response is used to indicate the presence of scanner 28. If a switch of the matrix is pressed upon the scanning of the columns and rows by the column enable and row enable logic, the pressed switch will cause the /POWEROUT current sink enable circuit 44 to generate the /POWEROUT signal when the trailing edge of the address pulse for the pressed switch goes below the threshold voltage level. The /POWEROUT signal will not be generated if none of the switches are pressed when the trailing edge of the address pulse goes below the threshold voltage level.

With /POWEROUT applied to current sink circuit 46, circuit 46 connects a low resistance between ground and bus 22. The /POWEROUT signal turns on PNP transistors 46A which conducts $SV_{CC}$ to the base of NPN transistor 46B causing transistor 46B to conduct and to apply a low resistance to bus 22. The current sink circuit turns off during the leading edges of the pulse train if the scanner is not present or not addressed and during the trailing edges if a switch of the matrix is not pressed.

After all 32 switches of the matrix have been scanned, the squarewave drops below 3 volts initiating a reset signal from reset circuit 52. The reset signal from circuit 52 routes to the 5 bit counter in the scanner module to reset all the stages to 0.

FIRMWARE OPERATIONS

The flow chart of FIG. 3 depicts the program executed by MCU 18. After START UP of the program and after the 20 ms power on delay, MCU 18 executes a small start-up program which sets all CPU registers with correct values and clears all information presently in memory before accepting information from D/R 20. MCU 18 also initializes the counters in RAM and the stored variables. The desired addresses to be sent over the bus to D/R 20 are stored in memory and all initial conditions are met.

In this embodiment, the stored information includes the sequence for addressing the keys of the matrix. As can be appreciated by those skilled in the art, MCU 18 operates in the MHz range while the rest of system 10 operates around the one kHz range. Hence, MCU 18 can perform many tasks before the remainder of system 10 reacts.

After defining terms in block 65, as indicated in processing-function block 66, the program tells MCU 18 to put Vcsc of bus 22 to 6 volts. In performing this instruction, MCU 18 writes to ports A and B in a manner providing to the inputs of the AND gates 1-4 in D/R 20 suitable logic signals to set the initial portion of the off-set squarewave at 6 volts.

The bus 22 is brought up to the initial 6 volts in order to obtain a quiescent power current (Ipwr) for the scanner 28. Then in the processing-function block 68, MCU 18 is told to measure Vq. MCU 18 measures Vq by reading the quiescent current (Iq) of the bus obtained through resistor 48 in D/R 20 and sent back to the A/D port of MCU 18. Vq is the voltage at the A/D input of MCU 18.

To establish a threshold voltage (Vth) for the bus, MCU 18 performs the calculations shown in equation (4).

$$\begin{aligned} Vth &= (Ipwr + \text{Noise Margin}) * \text{Diff Amp Gain} * R \\ &= (2 \text{ mA} + 15 \text{ mA}/2) * 10 * 10 \text{ ohms} \\ &= (2 \text{ mA} + 7.5 \text{ mA}) * 100 \text{ ohms} \\ &= 9.5 \text{ mA} * 100 \text{ ohms} \\ &= 0.95 \text{ V} \end{aligned} \quad (4)$$

The quiescent voltage Vq is derived in equation (6)

$$Vq = 10 * R * Iq \quad (6)$$

where
Iq=Ipwr if a sw is open
and Iq=Ipwr+Isw if sw0 is closed $$\begin{aligned} Vq &= 10 * 10 \text{ ohm} * 2 \text{ mA} \\ &= 0.2 \text{ V if a sw is open} \end{aligned} \quad (6a)$$

$$\begin{aligned} Vq &= 10 * 10 \text{ ohms} * (2 \text{ mA} + 15 \text{ mA}) \\ &= 100 \text{ ohms} * 17 \text{ mA} \\ &= 1.7 \text{ V is a sw is closed} \end{aligned} \quad (6b)$$

If MCU 18 determines that the Vq is greater than 2 times Vth, as in decision block 102, then MCU 18 must check to see whether or not the bus has shorted. If Vq is less than 2 times Vth, then MCU 18 takes the NO branch and proceeds to process function block 74 to set the bus to 9 volts.

If, as indicated in decision block 102, Vq is greater than 2 times Vth, then MCU 18 determines whether or not this is the first bus short. If it is the first time that the bus has been shorted, then MCU 18 takes the YES branch and proceeds to process function block 108 and resets the bus three times. Then MCU 18 is instructed to put the bus at 6 volts as indicated in function block 66 and the measurements of Vq is repeated again. If it is determined that the bus is not shorted, then MCU 18 takes the NO branch and proceeds to set the bus to 9 volts as in process function block 74 and then MCU 18 is instructed to read the current on the bus as indicated in process function block 76. MCU 18 now examines the 32 keys to determine whether or not any keys have been pressed. Hence, in decision block 78, MCU 18 is instructed to determine if any keys are present. If a key is present, then MCU 18 is instructed as in process function block 82 to set the key present bit. If MCU 18 detects that there is not a key present, then MCU 18 is instructed to clear the key present bit as indicated in process function block 80. In either case, MCU 18 is instructed to change the bus to 6 volts and then read as indicated in process function block 84 and then to read the current on the bus as indicated on process function block 86.

Assuming that the keys are present, MCU 18 must make a decision as to whether or not a key is closed as indicated in decision 90. If a key is closed, then MCU 18 is instructed as in process function block 94 to set the key close bit. If the key is determined to be open, then MCU 18 is instructed to clear the key closed bit as indicated in process function block 92.

Then MCU 18 makes a decision as to whether or not all addresses have been polled as is indicated in decision block 96. If all addresses have been polled, then MCU 18 is instructed as in process function block 98 to set other portions of the display according to the detected switch closures and then MCU 18 is then instructed to reset the bus voltage as indicated in process function block 100 and proceed back to function block 66. If all addresses have not been polled, then MCU 18 goes back to process function block 74 and proceeds to set for the remaining keys to determine whether or not they are present and then whether or not they are closed.

It is to be understood that the above-described embodiment is mainly illustrative of the principles of the present invention. Although a discrete embodiment is disclosed, an integrated embodiment equivalent could be developed. One skilled in the art may make changes and modifications to the embodiments disclosed herein and may devise other embodiments without the departing from the scope and essential characteristics thereof.

I claim:

1. A single wire bus multiplex system for a smart multiple switch scanner for use with a pulse-train signal comprising a succession of coded-pulse signals superimposed over an offset-voltage signal, said coded-pulse signals providing a series of address codes for addressing a plurality of switches arranged as a matrix of switches at a remote location, said matrix comprising a plurality of row and column lines with each one of said plurality of switches having a post connected to a row line and another post connected to a column, said system comprising:
    (a) means for generating the pulse-train signal;
    (b) a bi-directional, single-wire bus adapted to transfer the pulse-train signal from a first end of said bus in a first direction to the remote location of the matrix and a series of current signals from a second end in a second direction, said bus being routed near the matrix;
    (c) switch scanning means connected between said bus and the matrix, responsive to said pulse-train signal comprising:
        (1) means for developing an internal power source from said offset-voltage signal;
        (2) means for decoding said coded-pulse signals to obtain a series of address codes for addressing each one of said plurality of switches of the matrix, said decoding means including an asynchronous counting means, said counting means having a capacity to count up to an exact count of twice the total number of switches in the matrix;
        (3) means for using said series of address codes to sequentially scan the column and row lines of the matrix so as to sequentially address each one of said plurality of switches; and
        (4) means for generating a first current signal on said bus in the second direction indicative that each one of said plurality of switches has been addressed and a second current signal indicative of each one of said plurality of switches being pressed;
    (d) analog means at the first end of said bus for receiving said first and second current signals on said bus and producing therefrom a series of analog voltage signal messages;
    (e) means for converting said analog voltage signal messages into a first series of digital-coded messages;
    (f) means responsive to the digital-coded messages for analyzing the digital-coded messages and providing a second series of digital-coded messages that provide an interpretation of the analyses; and
    (g) display means responsive to said second series of digital-coded messages for transforming said second series of digital-coded messages into a visible intelligible message.

2. Apparatus in accordance with claim 1 wherein said pulse-train signal generating means includes:
    (a) a regulated voltage source means coupled to a fixed voltage source for producing a regulated voltage of a chosen voltage level;
    (b) a microcontroller means powered from said regulated voltage source means including means for generating a series of logic signals for forming the pulse-train signal; and
    (c) a driver/receiver means comprising combinational logic, switching and analog circuits for accepting said series of logic signals and producing therefrom the pulse-train signal.

3. Apparatus in accordance with claim 2 wherein the pulse-train signal has at least six "states", namely: a first "state" that rises from a reference voltage to a first voltage level, a second "state" that rises from said first voltage level to a threshold voltage level, a third "state" that rises from said threshold voltage level to a maximum voltage level above said threshold voltage level, a fourth "state" that descends from said maximum voltage level to said threshold voltage level, a fifth "state" that descends from said threshold voltage level to said first voltage level and a sixth "state" that descends from said fifth "state" to said reference voltage.

4. Apparatus in accordance to claim 3 wherein:
    said internal power source developing means is responsive to each "state" of the pulse-train signal above said second "state" and connects to the fixed voltage source for generating a regulated fixed voltage signal for providing power internally to said switch scanner means; said decoding means is an overthreshold detection means responsive to the pulse-train signal when each pulse of the pulse-train signal goes above said threshold voltage for generating a series of overthreshold clock signals;

said counting means is a binary counter means responsive to said overthreshold clock signals for generating a series of clock-output signals that provide a running total count of the pulses in the pulse-train signal, said binary counter means including a delay means for causing said counter means to count to a value equal to a modulo count of said counter means; said sequentially scan means includes first combinational logic means responsive to said series of clock output signals for generating a series of logic signals to an input of the matrix of switches for sequentially enabling chosen lines of the matrix in order to scan the matrix to address each switch and to detect the occurrence of a coupling of a row line to a column line by the addressed switch in response to that addressed switch being pressed causing a current signal to appear at an output of the matrix; and said means for generating said first and second current signals on said bus in the second direction includes another combinational logic means coupled to said counter means and to said first combinational means for generating a current sink enabling signal used to transmit the current signal over the bus in the second direction indicative of a pressed switch and current sink means responsive to said current sink enabling signal for causing a first increased current signal on the bus in a manner that indicates a presence of a switch after said forth "state" of the pulse causing said switch-pressed signal and for causing a second increased current signal on the bus in a manner indicative of a switch being pressed after said fifth "state".

5. Apparatus in accordance with claim 4 wherein a switching means coupled to said first and another combinational logic means permit enabling the lines of the matrix in a manner that allows the matrix of switches to be transformed into a second matrix of switches causing the count of switches to equal the modulo count of said counter means.

6. Apparatus in accordance with claim 5 wherein said means for converting said analog-message signals into digital-coded messages is an analog-to-digital converter in said microcontroller means.

7. Apparatus in accordance with claim 6 wherein said means for analyzing, interpreting and providing said another digital-coded message include:
  (a) first measuring means for obtaining a measure of a voltage on the bus during said second "state" of the pulse-train signal for determining whether the voltage is above a threshold voltage of said bus, the voltage not being above the threshold voltage is indicative of a normal bus voltage;
  (b) second measuring means for determining if said bus is "shorted" during said second "state" of the pulse-train, said bus being shorted when the voltage on said bus at this time is above twice the threshold voltage;
  (c) third measuring means for determining the current in the second direction of said bus during said forth "state" of the pulse train signal for determining whether the switch that is present is pressed, said switch being pressed when said second increased current on said bus occurs; and
  (d) digitized message means for providing a digitally-coded measure to said display means indicative of the state of said bus and the status of the pressed switch.

8. Apparatus in accordance with claim 7 wherein said first through fourth measuring means, said digitized message means and said means for generating said series of logic signals for forming the pulse train are realized by said microcontroller means carrying out instructions in firmware.

9. Apparatus in accordance with claim 8 wherein said switch scanner means also includes a reset circuit means responsive to said sixth "state" for providing a reset signal to said counting means upon completion of the decoding of a last address code with the pulse train.

10. Apparatus in accordance with claim 9 wherein the pulse-train signal includes a series of pulse trains, each pulse train containing the series of address codes for addressing each switch in the matrix, each series of pulse trains starting with said first "state" and terminating with said sixth "state".

* * * * *